United States Patent [19]

Arnold

[11] Patent Number: 4,516,103

[45] Date of Patent: May 7, 1985

[54] PLUG-IN ARRANGEMENT AND PROCESS FOR TIN PLATING CONTACTS OF A PLUG-IN ARRANGEMENT

[75] Inventor: Ernst Arnold, Buchs, Switzerland

[73] Assignee: Meteor AG, Ruschlikon, Switzerland

[21] Appl. No.: 525,645

[22] Filed: Aug. 23, 1983

[30] Foreign Application Priority Data

May 17, 1983 [CH] Switzerland .......................... 2674/83

[51] Int. Cl.³ ........................ H01F 15/02; H01F 15/10
[52] U.S. Cl. .................................. 336/65; 174/94 R; 228/173.4; 336/192; 339/278 R
[58] Field of Search .......... 339/275 R, 275 A, 275 B, 339/275 C, 278 R; 228/254, 173 E, 179; 336/192, 65; 174/138 R, 94 R

[56] References Cited

U.S. PATENT DOCUMENTS

3,555,477  1/1971  Hildebrandt ........................ 336/192
3,947,795  3/1976  Donnelly et al. ................ 336/192 X

FOREIGN PATENT DOCUMENTS

1110258  7/1961  Fed. Rep. of Germany ... 174/138 R
1949413  4/1971  Fed. Rep. of Germany .... 174/94 R
3312536  6/1984  Fed. Rep. of Germany .
1392960  12/1965  France ................................ 336/192

Primary Examiner—Thomas J. Kozma
Attorney, Agent, or Firm—Burns, Doane, Swecker & Mathis

[57] ABSTRACT

The present invention relates to a plug-in arrangement for circuit boards and a process for tin plating contact pins of the arrangement. The present invention improves the tinning of winding end portions of a winding about nonmetallic contact pins on coil forms. The contact pins are adapted for connection with printed circuits. The present invention discloses contact pins in one piece, or with multiple parts, which pins are given a profiled configuration on an outer surface. The contact pins may have different profiled shapes or configurations including grooves. In the case of multiple part contact pins, gaps are provided between the parts. The grooves or gaps permit the escape of gas generated upon the burning of an enamel insulation layer on the winding end portions. Also, the end portions rest above bottoms of the grooves or gaps such that the end portions are surrounded with tin solder.

15 Claims, 11 Drawing Figures

PLUG-IN ARRANGEMENT AND PROCESS FOR TIN PLATING CONTACTS OF A PLUG-IN ARRANGEMENT

BACKGROUND AND SUMMARY OF THE INVENTION

The present invention relates to a plug-in arrangement for printed circuits and to a process for the tin plating of contact pins of the plug-in arrangement.

For the assembly of printed circuits with electric components, in particular coils, the coils are preferably formed about coil forms with contact pins. The coil ends are twisted onto the contact pins and soldered. Thereafter, the pins are inserted into corresponding openings in the printed circuit and soldered to the printed circuit.

The contact pins of the coil forms used heretofore are formed as a unit together with the coil form. The coil forms generally consist of a synthetic plastic material. The contact pins may have different cross sections, for example round, semi-circular, oval and the like. The coil ends or end portions of the winding are twisted tightly onto the contact pins (see Swiss Application No. 7,034/82-5, filed Dec. 3, 1982, or in the alternative, its West German Analog, DE-OS No. 33 12 536, laid open for public inspection on June 7, 1984, or its U.S. Analog, U.S. patent application Ser. No. 641,947 (PCT/CH83/00133, International filing date Nov. 28, 1983) by the same inventor as that of the present application). The twisting is effected in a manner so that the wire ends are wound or twisted parallel to each other over the contact pin. In this way, electrical contact can be obtained between the coil and the printed circuits by inserting the contact pins in the printed circuits and soldering the pins and coil end portions to the printed circuits without the use of additional metal pins. According to the above-mentioned Swiss application, the contact pins may also be arranged at an angle with respect to the coil form, whereupon the end portions of the coil around the contact pins are soldered to the surface of the circuit.

When enamelled copper wire with a single insulation layer is used, the insulation layer evaporates due to the thermal effect of soldering, and normally no great difficulties are encountered in obtaining a proper soldering in a soldering bath. Multiple insulation layer enamelled copper wire is, in itself, more difficult to solder and requires both substantially higher temperatures, for example 480°–500° C. as compared to a temperature of less than 400° C. required for use with wires with a single insulation layer, and significantly longer soldering times of more than 5 sec. Various problems are encountered when utilizing multiple insulation layer wires including a deterioration of the soldering properties, for example, by excessive slag formation. Further, the tinning of the contact pins is non-uniform as a result of the lack of thermal conductivity, for example, of the synthetic plastic material of the contact pins. Hence, the coil end portions in contact with the plastic pins may have enamel residues. Further, melting vapors of the insulating material may come to the surface in the form of explosions, leading to the formation of tin spatters and blisters. Still, further, since the distance between the individual contact pins is very small, there is a danger of bridging across adjacent pins and thus, short circuits may occur across the finished coil. The use of an automatic soldering process requires constant monitoring of the soldering operation. Even with intensive controls and constant monitoring, non-uniform soldering quality and thus high rejection rates are unavoidable.

It is therefore an object of the present invention to provide a plug-in arrangement for printed circuits, in particular, on electric coils with nonmetallic coil forms and contact pins, whereby the secure attachment of the coil end portions to the contact pins after soldering is assured. Further, it is an object of the present invention to provide a process for the proper tinning of the pins without requiring constant monitoring of the wound contact pins so that insulation stripping is effected simultaneously with tinning.

These objects and others are attained according to the invention. In accordance with the present invention, the plug-in arrangement includes a coil wound around a coil form which has contact pins thereon. The coil form and the contact pins are a single nonmetallic piece and end portions of the coil winding surround the contact pins. Each of the contact pins is provided with a profiled exterior surface.

In accordance with the process of the present invention, the tinning of the end portions of the coil surrounding the contact pins is accomplished by immersing the pins in a tin bath. The profiled exterior surfaces of the pins include grooves or gaps. Upon immersion of the pins, the tin covers the coil winding end portions and fills the grooves and gaps in the pins to surround the end portions and to retain the winding end portions on the pins.

One particular advantage of providing the contact pins with a profiled configuration according to the present invention is that, as a result of the shape of the contact pins, the wire end portions twisted onto the pins are not resting on the entire exterior surface of the pins, but rather only on the raised portions of the profile. This partial contact between the winding end portions and the exterior surface of the pins permits the soldering tin to penetrate into the grooves or gaps in the pins and thus reach a rear side of the wire end portions. Therefore, the tinning of the wire coil end portions occurs substantially uniformly over their entire circumference. Furthermore, degassing, i.e., the escape of gasses formed when the insulating layers of enamel are melted by the soldering temperature, becomes feasible within the profile recesses or grooves. The blistering or explosive escape of these vapors through the windings is prevented and uniform tinning further assured. Moreover, slipping of individual layers of the winding of the end portions and crumbling of the tinning in certain locations are also prevented.

It is further possible when using the contact pins according to the invention to simultaneously process coils having wires of different thicknesses in the same soldering bath.

BRIEF DESCRIPTION OF THE DRAWING FIGURES

Preferred embodiments of the contact pins and the process of tinning according to the present invention will be described in greater detail in the following with reference to the accompanying drawings, wherein like members bear like reference numerals and wherein.

DETAILED DESCRIPTION OF THE PREFERRED EMBODIMENTS

Figure 1:
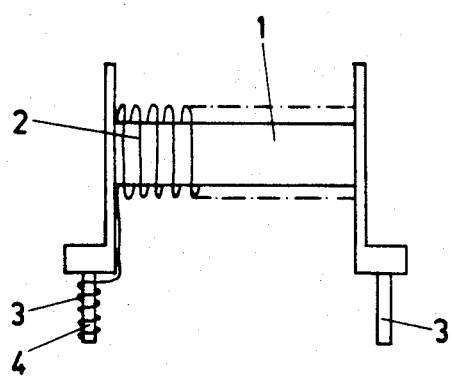
FIG. 1 is a lateral elevational view of an electric coil with contact pins, wherein an end portion of the wire of the coil is wound around one of the contact pins.
Figure 2:
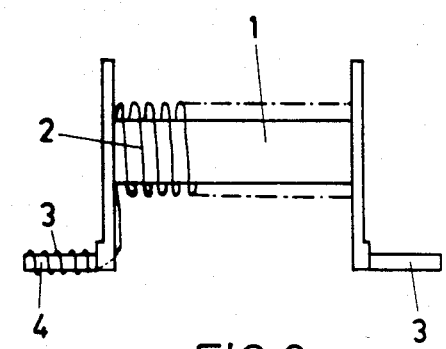
FIG. 2 is a lateral elevational view of a further embodiment of a coil, similar to FIG. 1, in which the contact pins are at a lateral angle.

With reference to FIGS. 1 and 2, a coil form 1 carries windings 2 of wire to form a coil. The coil form 1 includes contact pins 3 arranged on a bottom side of the coil form 1. The coil form 1 and the contact pins 3 preferably consist of a synthetic plastic material and are produced in a single piece. In FIG. 1, the contact pins 3 are plug-in pins, while those according to FIG. 2 are bent laterally, preferably at an angle of 90°. The windings 2 consist of an insulated wire, preferably enamelled copper wire, and end portions 4 of the coil or windings 2 are wound in layers around the contact pins 3 and subsequently tinned. The winding end portion 4 (FIG. 1) are wound around the contact pins 3 so that upon insertion into a printed circuit (not shown), the contact pins 3 and winding end portions 4 fit into openings (not shown) of the printed circuit and may be soldered to terminals (not shown) of the printed circuit. In the arrangement with the angled contact pins (FIG. 2), the tinned winding end portions 4 are soldered to a suitable circuit board (not shown).

The contact pins 3, described with reference to FIGS. 1 and 2, include a profiled exterior surface according to the invention. This profiled surface may be formed in a single part contact pin (FIGS. 3a and 3b) or in multiple part contact pins (FIGS. 3c–3e). With refrence to FIG. 3a, the contact pins 3 have a generally square cross section and are provided on their external surface with grooves 5 along a longitudinal axis of the pins 3. The winding end portions 4 are wound around the contact pin 3 generally transverse to the direction of the grooves 5 so that bottoms of the grooves 5 are covered at a distance by the winding end portions 4. With reference to FIG. 3b, a star shaped cross section of the contact pin 3 may be provided wherein the winding end portions 4 are again covering the grooves 5 freely in layers and spaced from the groove bottoms.

In the single part configurations of the contact pins 3 (FIGS. 3a and 3b), each groove 5 is filled with tin solder during the tinning of the winding end portions 4 and thus covers the winding end portions 4 from all sides, i.e., substantially surrounds the end portions 4. In this way, the various windings of the end portions 4 are secured to each other. Simultaneously with tinning, gases generated by the effect of heat on the enamel insulation of the winding end portions 4 may escape through the grooves 5 in the course of the tinning process. Accordingly, the blistering of the winding end portions 4 wound in layers is thereby prevented.

With reference to FIGS. 3c to 3e, the contact pins 3 may consist of several parts. In a first embodiment (FIG. 3c), the contact pins 3, 3' have a configuration such that their cross section is semi-oval with a gap 6 being provided between the contact pins 3, 3'. The gap 6 has the same function as the grooves 5 in the configurations described hereinabove of the single part contact pins 3.

Figure 3A:
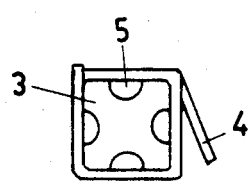
FIGS. 3a, 3b, 3f, 3g and 3h are schematic cross-sectional views of different embodiments of profile configurations of the contact pins.
Figure 3B:
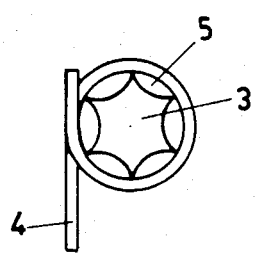
Figure 3C:
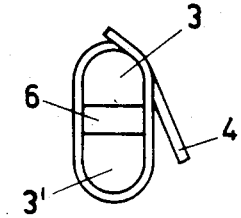
FIGS. 3c–3e, and 3i are schematic cross-sectional views of multiple part embodiments of the contact pins according to the present invention.
Figure 3D:
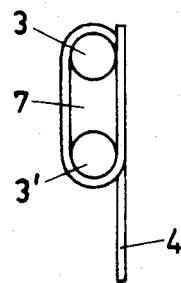
Figure 3E:
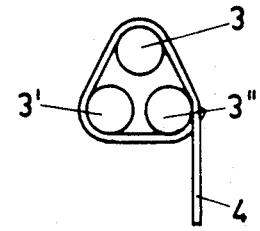

Furthermore, according to FIG. 3d, two contact pins 3, 3' may be provided with an overall cross-sectional area which corresponds to the total cross-sectional area of a single part contact pin (FIGS. 3a and 3b). The winding end portions 4 in this case are again wound in layers around both contact pins 3, 3', with a gap 7 formed between the two pins 3, 3'. The gap 7 performs the function of the grooves 5 in the single part configuration of the contact pins 3.

It is further possible to provide a configuration including a plurality of thin contact pins having an overall cross-sectional area approximately equal to that of the cross-sectional area of a single part contact pin 3. As shown in FIG. 3e, three contact pins 3, 3', 3" may be arranged, for example, in the shape of an equilateral triangle and wound with the winding end portions 4. This configuration is suitable for cases where wires of different thicknesses are used for the windings 2, since greater degassing of the insulation layers of wires of different thicknesses is required.

The present invention is not restricted to the configuration or profile of the contact pins illustrated in the drawings and described hereinabove in connection with FIGS. 3a–3e. Thus, for example, a helical or circular configuration, as shown in FIG. 3f or 3g, respectively, or any other shape, for example, T, I or diabolo forms, may be suitable as an appropriate cross section. The configuration should have a void, channels grooves 5 or a gap 6 to provide space both between portions of the exterior surface of the body of the contact pin and the winding layers formed by the winding end portions 4 over the circumference of the contact pin 3 and between the individual contact surfaces of the winding end portions 4. The void, grooves or gap serves, on the one hand, to exhaust the combustion gases caused by burning of the enamel insulation (degassing) and also, to surround the wire end portions 4 with tin solder. In this way, the winding layers of the end portions are securely connected with each other in the axial direction of the contact pin.

Figure 3H:
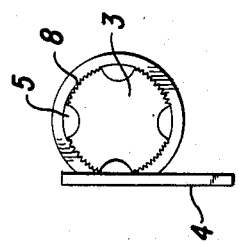
Figure 3G:
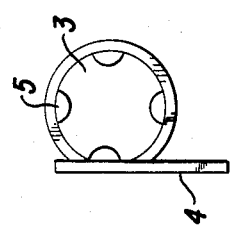
Figure 3I:
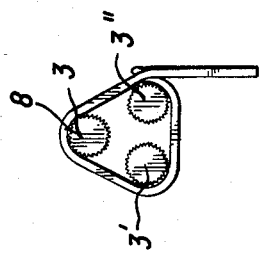
Figure 3F:
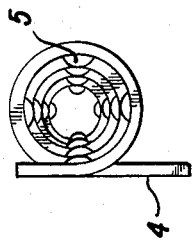

By roughening the surface of the contact pins as shown in FIGS. 3h and 3i, a further improved hold of the wire end portions 4 on the contact pin 3 or pins 3, 3', 3" may be obtained.

According to the process of the present invention for the tinning of the plug-in arrangement wound with the winding end portions 4, the previously wound contact pin 3 or pins 3, 3', 3" are immersed in a tin bath. The voids created by the grooves 5 or the gap 6 in the single and multiple part configurations, respectively, between the contact pin or pins and the winding end portions 4 are filled during the immersion in a tin bath (not shown) containing liquid tin. Simultaneously during insertion, the enamel insulation on the wire end portions 4 is burned off due to the temperature of the tin bath, thereby generating gases which may escape through the grooves 5 or the gap 6. In this way, the winding end portions 4 are covered by the tin solder without blistering and without the spattering of the tin. Subsequently, secure mounting and good electrical contact upon insertion into or soldering onto the printed circuit is obtained.

The principles, preferred embodiments and mode of operation of the present invention have been described in the foregoing specification. However, the invention which is intended to be protected is not to be construed as limited to the particular embodiments disclosed. The embodiments are to be regarded as illustrative rather than restrictive. Variations and changes may be made by others without departing from the spirit of the present invention. Accordingly, it is expressly intended that all such variations and changes which fall within the spirit and scope of the present invention as defined in claims be embraced thereby.

WHAT IS CLAIMED IS:

1. A plug-in arrangement for printed circuits, comprising electric coil windings surrounding a coil form having contact pins, the coil form and the contact pins being nonmetallic, end portions of the windings surrounding the contact pins, the contact pins being profiled and having continuous channels extending in the longitudinal direction along an axis of the contact pins, said channels creating spaces between said pins and said surrounding end portions which extend generally transverse to said channels, and solder beneath said end portions in said spaces.

2. The plug-in arrangement according to claim 1, wherein the contact pins have a circular cross section with the channels in the longitudinal direction extending along an axis of the contact pins.

3. The plug-in arrangement according to claim 1, wherein the contact pins have a square cross section with the channels in the longitudinal direction extending along an axis generally transverse to a direction of winding the end portions.

4. The plug-in arrangement according to claim 1, wherein the contact pins have a star-shaped cross section with the channels in the longitudinal direction extending along a longitudinal axis of the pins.

5. The plug-in arrangement according to claim 1, wherein the contact pins are in multiple parts, the individual parts being spaced apart in the longitudinal direction by intermediate spaces to form said channels.

6. The plug-in arrangement according to Claim 1, wherein the profiling of the contact pins is generally along an axis of the contact pins.

7. The plug-in arrangement according to Claim 1, wherein the profile is helical.

8. The plug-in arrangement according to Claim 1, wherein the exterior surface of the contact pins is roughened.

9. The plug-in arrangement according to Claim 1, wherein the end portions are wound in layers, said end portions covering the profiled surface of the contact pins and being spaced from bottoms of the profiled surface.

10. A process for tinning of a plug-in arrangement, the plug-in arrangement including electric coil windings surrounding a non-metallic coil form having non-metallic contact pins formed integrally therewith, the contact pins having a profiled exterior surface and creating channels, comprising the steps of winding end portions of the windings generally transversely around the longitudinal axis of the profiled pins such that spaces formed by said channels exist between the end portions and the profiled surface, immersing the contact pins in a tin bath, and permitting the spaces to be filled with tin to surround the end portions and to retain said end portions to the contact pins.

11. The process according to claim 10, further comprising the step of permitting gases generated upon immersion of the pins in the bath from burning off insulation on said end portions to escape through said spaces.

12. The plug-in arrangement according to claim 1, wherein the contact pins having an exterior surface, and the channels forming grooves in said exterior surface to such a depth as to create said space along each groove between said pins and said surrounding end portions of said windings.

13. The plug-in arrangement according to claim 1, wherein at least the end portions of the coil windings being coated with multiple layers of enamel insulation.

14. The plug-in arrangement of claim 8, wherein the exterior surfaces of the multiple parts are roughened.

15. The plug-in arrangement according to claim 1, wherein the coil form and the contact pins being of a single-piece construction.

* * * * *